(12) United States Patent
Amber et al.

(10) Patent No.: US 7,242,583 B2
(45) Date of Patent: Jul. 10, 2007

(54) SYSTEM FOR LOADING A HEAT SINK MECHANISM INDEPENDENTLY OF CLAMPING LOAD ON ELECTRICAL DEVICE

(75) Inventors: Glenn M. Amber, Bridgewater, MA (US); Roger E. Weiss, Foxborough, MA (US)

(73) Assignee: Paricon Technologies, Corporation, Fall River, MA (US)

(*) Notice: Subject to any disclaimer, the term of this patent is extended or adjusted under 35 U.S.C. 154(b) by 15 days.

(21) Appl. No.: 10/737,312

(22) Filed: Dec. 16, 2003

(65) Prior Publication Data
US 2004/0125570 A1   Jul. 1, 2004

Related U.S. Application Data

(60) Provisional application No. 60/433,729, filed on Dec. 16, 2002.

(51) Int. Cl.
*H05K 7/20* (2006.01)
(52) U.S. Cl. ............... 361/707; 361/704; 361/709; 439/487
(58) Field of Classification Search .......... 361/704, 361/707, 709, 719; 257/712, 718, 719, 727; 174/16.1, 16.3; 165/80.3, 185; 439/73, 439/331, 485, 487
See application file for complete search history.

(56) References Cited

U.S. PATENT DOCUMENTS

| | | | | |
|---|---|---|---|---|
| 4,899,210 A | * | 2/1990 | Lorenzetti et al. ......... | 257/712 |
| 4,918,571 A | * | 4/1990 | Grabbe ....................... | 361/718 |
| 5,010,949 A | * | 4/1991 | Dehaine ...................... | 165/76 |
| 5,055,909 A | * | 10/1991 | Culver ....................... | 257/717 |
| 5,127,837 A | * | 7/1992 | Shah et al. ................... | 439/71 |
| 5,168,926 A | * | 12/1992 | Watson et al. ............. | 165/185 |
| 5,200,365 A | * | 4/1993 | Culver ....................... | 156/60 |
| 5,296,739 A | * | 3/1994 | Heilbronner et al. ....... | 257/687 |
| 5,379,188 A | * | 1/1995 | Winslow .................... | 361/760 |
| 5,397,919 A | * | 3/1995 | Tata et al. .................. | 257/717 |
| 5,424,580 A | * | 6/1995 | Tustaniwskyj et al. ..... | 257/713 |
| 5,740,014 A | * | 4/1998 | Lin ............................ | 361/697 |
| 5,931,222 A | * | 8/1999 | Toy et al. ................... | 165/80.3 |
| 6,014,315 A | * | 1/2000 | McCullough et al. ....... | 361/704 |
| 6,058,014 A | * | 5/2000 | Choudhury et al. ........ | 361/704 |
| 6,101,093 A | * | 8/2000 | Wong et al. ................ | 361/709 |
| 6,101,096 A | * | 8/2000 | MacGregor et al. ........ | 361/720 |
| 6,115,909 A | * | 9/2000 | Miller ......................... | 29/741 |
| 6,198,630 B1 | * | 3/2001 | Cromwell .................... | 361/704 |
| 6,209,623 B1 | * | 4/2001 | Tantoush ..................... | 165/80.3 |

(Continued)

*Primary Examiner*—Jayprakash Gandhi
*Assistant Examiner*—Robert J. Hoffberg
(74) *Attorney, Agent, or Firm*—Brian M. Dingman; Mirick, O'Connell, DeMallie & Lougee

(57) ABSTRACT

A system for coupling a heat sink to an electrical device independently of a clamping member that is used to place a coupling force between the electrical device and a substrate to which the electrical device is to be electrically connected. The system includes a clamping member adapted to push the electrical device against the substrate, to assist in electrical connection between the electrical device and the substrate, the clamping member defining a through-hole leading to the electrical device. There is also a heat-conducting member in the clamping member through-hole and adapted to thermally contact the electrical device to conduct heat away from the electrical device. A heat sink is in thermal contact with the heat-conducting member, to dissipate heat from the electrical device.

13 Claims, 2 Drawing Sheets

U.S. PATENT DOCUMENTS

| | | |
|---|---|---|
| 6,288,371 B1 * | 9/2001 | Hamilton et al. ............ 219/530 |
| 6,293,331 B1 * | 9/2001 | Wang ........................ 165/80.3 |
| 6,318,451 B1 * | 11/2001 | Lee et al. .................. 165/80.3 |
| 6,356,448 B1 * | 3/2002 | DiBene et al. ............... 361/721 |
| 6,412,546 B1 * | 7/2002 | Lin et al. .................... 165/80.3 |
| 6,426,878 B2 * | 7/2002 | Tanioka et al. ............. 361/760 |
| 6,504,243 B1 * | 1/2003 | Andric et al. ............... 257/718 |

* cited by examiner

SYSTEM FOR LOADING A HEAT SINK MECHANISM INDEPENDENTLY OF CLAMPING LOAD ON ELECTRICAL DEVICE

CROSS REFERENCE TO RELATED APPLICATION

This application claims priority of Provisional application Ser. No. 60/433,729, filed on Dec. 16, 2002.

FIELD OF THE INVENTION

This invention relates to systems that involve clamping of electrical devices to substrates while at the same time removing heat from the substrates.

BACKGROUND OF THE INVENTION

In a typical connector, an electrical device such as a computer chip is electrically connected to the pad array on a chip carrier or substrate board by applying pressure to the top surface of the device with a rigid clamping element. The electrical connection is then made through a variety of conductors or conductive contacts, including but not limited to: an electrically conductive interposer material, mechanical pins, conductive contact pads, or conductive materials.

Most times, proper electrical contact between the device and the substrate requires a particular compressive load that is proportional to the number of contacts. This compressive load is typically applied to the device by a rigid plate activated by any of a number of different controlled-force or controlled-displacement mechanisms.

In a typical connector, the device is contacted over its entire contact surface by the full pressure of the clamping member. Often there are regions on the device that could be damaged by contact at full clamping pressure. If these areas are relieved in the clamping member such that the clamping member does not touch the device in the relieved areas, there might be insufficient heat transfer into or out of the device.

SUMMARY OF THE INVENTION

The invention allows the pressure on the sensitive areas of the device to be independently controlled from the heat transfer function, to maintain sufficient pressure for both effective electrical interconnect and effective heat transfer. The clamping member is thereby de-coupled from any heat transfer functionality, and can exert sufficient clamping force to insure proper connector function.

This invention features a heat sink loading system that allows pressure to be applied between the heat sink and the electrical device independently of the connector clamping force. The preferred embodiment of the system has a heat sink, clamping member, spring element, post, and electrical device. The clamping member is preferably a rigid component that applies a compressive force on the device (or perhaps simultaneously on more than one device) by means of an external mechanism that does not form a part of this invention. The clamping member can have relief volumes machined into its contact surface with the device(s) to accommodate the shape of the top surface of the device(s). The relieved areas allow the clamping force to be transferred to the device(s) without contacting selected areas on the surface of the device(s). The clamping member has a hole through it with its axis at a specified angle to the clamping surface of the member. This angle is typically 90 degrees, but could be any angle up to 90 degrees. The post can freely slide through this hole along a single axis. The bottom of the post is shaped to conform to the surface of the device from which or to which the heat will be transferred. A spring element is located between the clamping member and the bottom plate of the post so that the spring element is compressed when the mechanism is assembled and thus applies a downward force on the post. Once fully assembled, the force applied to the post will insure contact pressure between the post and the device, so that heat is transferred between the device and the heat sink through the post. The heat sink is located on the end of the post opposite the surface contacting the device, outside of the clamping member.

BRIEF DESCRIPTION OF THE DRAWINGS

Other objects, features and advantages will occur to those skilled in the art from the following description of the preferred embodiment and the accompanying drawings, in which.

DETAILED DESCRIPTION OF THE PREFERRED EMBODIMENTS

The invention may be accomplished in a system for coupling a heat sink to an electrical device independently of a clamping member that is used to place a coupling force between the electrical device and a substrate to which the electrical device is to be electrically connected. The system includes a clamping member that is adapted to push one or more electrical devices against the substrate. The clamping member assists making the electrical connection between the one or more electrical devices and the substrate. The clamping member defines a through-hole leading to each electrical device. A heat-conducting member is located in the clamping member through-hole. This member is adapted to thermally contact the electrical device to conduct heat toward or away from the electrical device. A heat sink is in thermal contact with the heat-conducting member. The heat sink can be a separate device or can be permanently fixed to the heat-conducting member.

Figure 1:
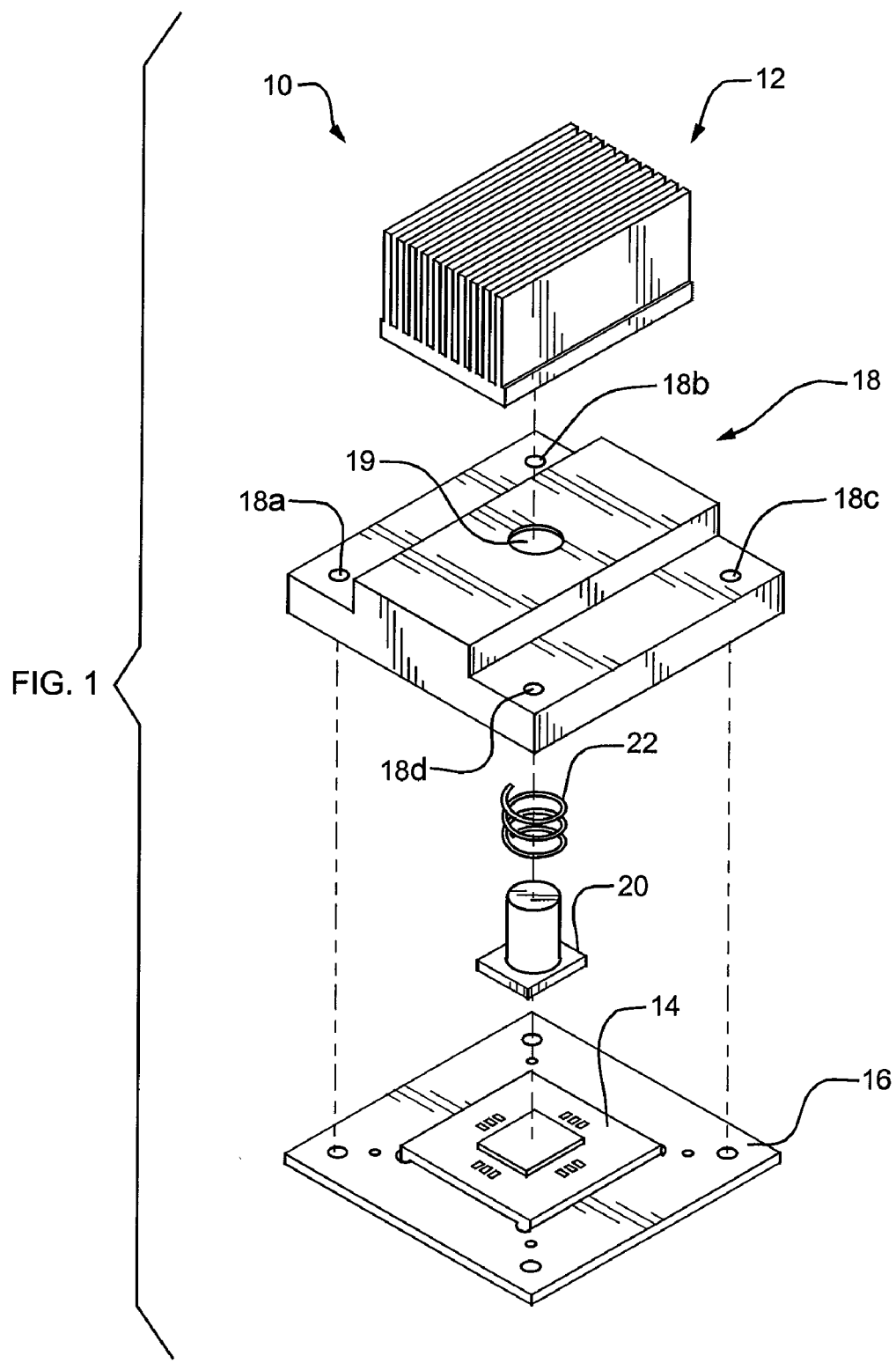
FIG. 1 is an exploded view of a preferred embodiment of this system of the invention.
Figure 2:
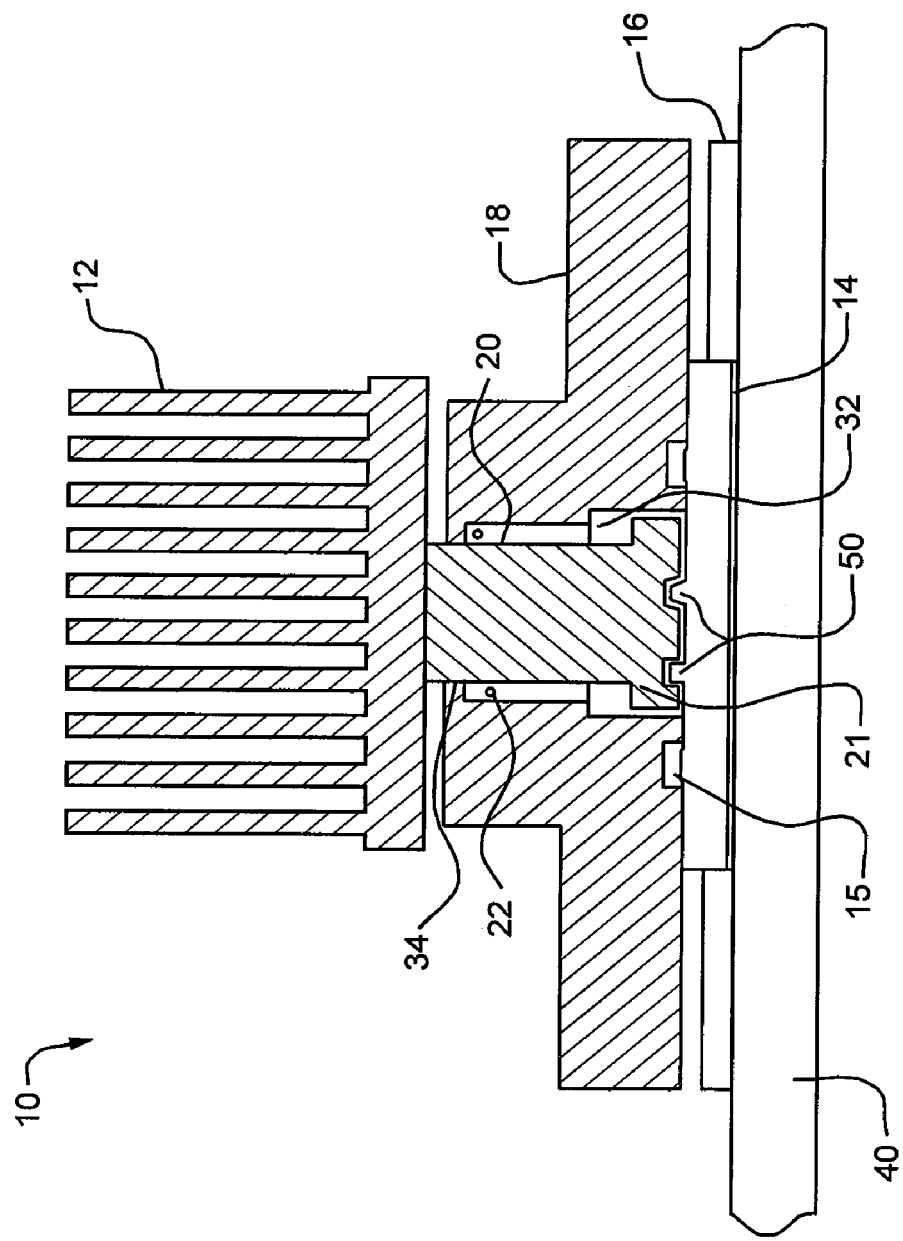
FIG. 2 is a cross-sectional view of the system of FIG. 1 in the assembled state.

The preferred embodiment of the system of the invention is shown in FIGS. 1 and 2. In system 10, heat sink 12 is coupled to electrical device 14 which is to be electrically connected to underlying substrate 40. Substrate 40 is typically a printed circuit board or equivalent. The system includes clamping member 18 that is adapted to push electrical device 14 against substrate 40 to assist in the electrical connection between the electrical device and the substrate. Alignment device 16 aligns device 14 to substrate 40. Hardware (not shown) passing through holes 18a-d is used to clamp member 18 against substrate 40. This arrangement is used most commonly for surface-mounted ASICs, or other situations in which the electrical device is not permanently affixed to the substrate. In such situations, the electrical device is not soldered to the substrate; it is thus necessary to push the electrical device against the substrate with sufficient force to properly make electrical contact between the two. The clamping member 18 applies a compressive force on device 14 by means of an external mecha nism (not shown) of the type well known in the art. Such separable clamping members are used in many work stations, including those from Sun Microsystems.

Clamping member 18 defines through-hole 19 that leads to electrical device 14. If member 18 clamps more than one device, there would be a through-hole leading to each device. Heat-conducting member 20 may be a metal post with enlarged bottom end section 21. Section 21 can be designed to have a desired shape and contour if necessary to make thermal contact with all or a portion of device 14 as needed to conduct heat away from the device without damaging sensitive areas of the device. In the embodiment shown, device 14 includes a rectangular central pedestal that is contacted with rectangular enlarged foot 21 of post 20. Post 20 can be made of aluminum or another heat-conductive material.

Opening 19 of clamping member 18 may be configured to define internal shoulder 32 that creates a narrowed region between shoulder 32 and the top of member 18 that is smaller than the width of enlarged end 21. This prevents the post from being removed from opening 19. Heat sink 12 is in thermal contact with heat-conducting member 20 to dissipate the heat that is conducted through member 20 from device 14. In this embodiment, heat sink 12 is a separate member that is placed in thermal contact with heat-conducting member 20. An alternative arrangement would be to have member 20 protrude sufficiently from opening 19 and define sufficient heat-radiating surfaces that the heat-conducting member itself could accomplish the heat sink functionality; in other words, to make the heat-conducting member and the heat sink integral. The same function could be accomplished by permanently connecting a separate heat sink to the heat-conducting member.

It is desirable to make as good a thermal contact as possible between heat-conducting member 20 and device 14. This can be accomplished by including in the system a resilient member located within the clamping member through-hole for urging the heat-conducting member into thermal contact with the electrical device. In the preferred embodiment shown in the drawings, the resilient member comprises coil spring 22 that is located around heat-conducting member 20 such that one end of spring 22 contacts enlarged portion 21 of member 20, and the other end contacts upper portion 34 of clamping member 18. In this arrangement, as clamping member 18 is pressed against electrical device 14, spring 22 is compressed to thereby push enlarged foot 21 against device 14 to assist in thermal contact between member 20 and device 14, which increases the efficiency of heat transfer away from device 14.

Clamping member 18 can have relief volumes such as annular volume 15 machined into its contact surface with electrical device 14 to accommodate the shape of the top surface of device 14. In the arrangement shown, machined volume 15 prevents member 18 from touching the electrical contacts at the top of device 14 that would otherwise be harmed by the pressure of the clamping member against the electrical device. Similarly, the lower surface 21 of member 20 can itself define relief volumes 50.

Other embodiments will occur to those skilled in the art and are within the following claims:

What is claimed is:

1. A system for coupling a heat sink to an electrical device having one or more electrical components independently of a clamping member that is used to place a coupling force between the electrical device and a substrate to which the electrical device is to be electrically connected, the system comprising: a clamping member for providing a compressive force on the electrical device against the substrate, the clamping member defining a through-hole leading to the electrical device, and further defining one or more relief volumes to prevent the clamping member from contacting a portion of a surface of the electrical device; a heat-conducting member in the through-hole of the clamping member and adapted to thermally contact the electrical device to conduct heat into or out of the electrical device, wherein the heat-conducting member provides a separate compressive force on the electrical device than the compressive force provided by the clamping member, where a lower surface of the heat-conducting member includes one or more relief volumes that prevent the heat-conducting member from contacting a portion of the surface of the electrical device; a resilient member located within the clamping member through-hole in which the heat-conducting member is located, for urging the heat-conducting member into thermal contact with the electrical device; and a heat sink in thermal contact with the heat-conducting member.

2. The coupling system of claim 1 in which the heat-conducting member comprises a post with an enlarged end that contacts the electrical device.

3. The coupling system of claim 2 in which the through-hole in the clamping member in which the heat-conducting post is located defines a shoulder between the heat sink and the electrical device, the shoulder defining a through-hole width that is less than width of the enlarged end of the post, to allow the post to move within the through-hole yet prevent the post from being withdrawn from the through-hole.

4. The coupling system of claim 1 in which the resilient member comprises a coil spring located around the heat-conducting member.

5. The coupling system of claim 1 in which one end of the resilient member contacts the heat-conducting member and the other end contacts the clamping member such that the resilient member is compressed when the clamping member is moved toward the substrate.

6. The coupling system of claim 1 in which the heat-conducting member protrudes from the clamping member.

7. The coupling system of claim 6 in which the heat sink is located outside of the clamping member.

8. The coupling system of claim 7 in which the heat sink directly contacts the heat-conducting member.

9. The coupling system of claim 6 in which the heat-conducting member and heat sink are integral.

10. The coupling system of claim 1 in which the clamping member directly contacts the electrical device.

11. The coupling system of claim 10 in which the clamping member directly contacts some but not all of an upper surface of the electrical device.

12. A system for coupling a heat sink to an electrical device having one or more electrical components independently of a clamping member that is used to place a coupling force between the electrical device and a substrate to which the electrical device is to be electrically connected, the system comprising: a clamping member for providing a compressive force on the electrical device, to push the or more electrical device against the substrate, the clamping member defining a through-hole leading to the electrical device, and further defining one or more relief volumes to prevent the clamping member from contacting a portion of a surface of the electrical device; a heat-conducting post in the through-hole of the clamping member with an enlarged end adapted to thermally contact the electrical device to conduct heat into or out of the electrical device, wherein the heat-conducting member provides a separate compressive force on the electrical device than the compressive force provided by the clamping member, where the enlarged end of the heat-conducting member includes one or more relief volumes that prevent the heat-conducting member from contacting a portion of a surface of the electrical device; a heat sink in thermal contact with the heat-conducting post; and a spring in the through-hole in the clamping member adapted to be compressed between the clamping member and the enlarged end of the post, to assist in thermal contact between the enlarged end and the electrical device.

13. The coupling system of claim 12 in which the spring comprises a coil spring located around the post.

* * * * *